US012615972B2

(12) United States Patent　　　(10) Patent No.:　US 12,615,972 B2

Culcer et al.　　　　　　　　　　(45) Date of Patent:　Apr. 28, 2026

(54) TOPOLOGICAL QUANTUM FIELD EFFECT TRANSISTOR

(71) Applicants:Monash University, Clayton (AU); NewSouth Innovations Pty Limited, Sydney (AU); University of Wollongong, New South Wales (AU)

(72) Inventors:　Dimitrie Culcer, Sydney (AU); Michael Sears Fuhrer, Clayton (AU); Muhammad Nadeem, Keiraville (AU)

(73) Assignees: Monash University, Clayton (AU); NewSouth Innovations Pty Limited, Sydney (AU); University of Wollongong, New South Wales (AU)

( * ) Notice:　Subject to any disclaimer, the term of this patent is extended or adjusted under 35 U.S.C. 154(b) by 389 days.

(21) Appl. No.:　18/251,981

(22) PCT Filed:　Nov. 5, 2021

(86) PCT No.:　PCT/AU2021/051306

§ 371 (c)(1),
(2) Date:　　May 5, 2023

(87) PCT Pub. No.:　WO2022/094666

PCT Pub. Date: May 12, 2022

(65)　　　　　Prior Publication Data

US 2023/0413700 A1　　Dec. 21, 2023

(30)　　　Foreign Application Priority Data

Nov. 6, 2020　(AU) ................................ 2020904052

(51) Int. Cl.
　　*H10N 99/00*　　　(2023.01)
(52) U.S. Cl.
　　CPC ............. *H10N 99/05* (2023.02); *H10N 99/03* (2023.02)

(58) Field of Classification Search
　　CPC ........ H10N 99/03; H10N 99/05; B82Y 10/00; H10D 48/385
　　See application file for complete search history.

(56)　　　　　　References Cited

U.S. PATENT DOCUMENTS

2012/0273763 A1　11/2012　Banerjee et al.
2015/0333163 A1　11/2015　Qiliang et al.
2021/0125651 A1*　4/2021　Wang .................... H10N 50/85

FOREIGN PATENT DOCUMENTS

CN　　　110010688 A　　7/2019
JP　　　2015-035478　　2/2015
WO　　WO 2019/084609　　5/2019

OTHER PUBLICATIONS

Gao, W. et al., "Novel two-dimensional monoelemental and ternary materials: growth, physics and application", Nanophotonics, 9(8), 2147-2168, Mar. 7, 2020. <DOI: https://doi.org/10.1515/nanoph-2019-0557>.

(Continued)

*Primary Examiner* — Changhyun Yi
(74) *Attorney, Agent, or Firm* — MLO, a professional corp.

(57)　　　　　　　ABSTRACT

A transistor comprises a planar layer of a topological material located between a gate electrode and a dielectric layer. The topological material exhibits a topological phase transition between a trivial state and a non-trivial state at a critical electric field strength on application of an electric field in a direction perpendicular to the planar layer. The topological material exhibits a change in bandgap, in the presence of the electric field, having a Rashba spin-dependent bandgap contribution that is at least three times as large as a non-spin-dependent bandgap contribution.

21 Claims, 4 Drawing Sheets

(56)          References Cited

OTHER PUBLICATIONS

Hirahara, T. et al., "Direct observation of spin splitting in bismuth surface states", Physical Review B 76.15, 153305. Oct. 12, 2007. <DOI:https://doi.org/10.1103/PhysRevB.76.153305>.

Jia, Y. Z. et al., "First-principles prediction of inversion-asymmetric topological insulator in hexagonal BiPbH monolaye", Journal of Materials Chemistry C, 4(37), 8750-8757, Aug. 3, 2016. <DOI:https://doi.org/10.1039/C6TC02692C>.

Nadeem, M. et al., "Quantum Anomalous Hall Effect in Magnetic Doped Topological Insulators and Ferromagnetic Spin-Gapless Semiconductors—A Perspective Review," Small 16.42 1904322, Sep. 11, 2020. <DOI: https://doi.org/10.1002/smll.201904322>.

Reyboz, M. et al., "Continuous model for independent double gate MOSFET", SolidState Electronics 53.5, 504-513, Mar. 28, 2009, [retrieved from the internet on May 5, 2023. <DOI: https://doi.org/10.1016/j.sse.2009.02.005>.

Liu, P. et al., "Topological nanomaterials", Nature Reviews Materials, Nature Publishing Group UK, London, 4(7), pp. 479-496, Jun. 4, 2019.

Ren, Y. et al., "Toplogical phases in two-dimensional materials: a review", Reports on Progress in Physics, GB, 79(6), pp. 66501, May 13, 2016.

Zhao, J. et al., "Turnable Rashba spin splitting in quantum-spin Hall-insulator AsF bilayers", Nano Research, Tsinghua University Press, CN, 10(2), pp. 491-502, Nov. 10, 2016.

European Search Report dated Aug. 5, 2025 for European Patent Office Patent Application No. 22891206.9.

Hong Li et al: "Negative capacitance tunneling field effect transistors based on monolayer arsenene, antimonene, and bismuthene", Semiconductor Science Technology, IOP Publishing Ltd, GB, vol. 34, No. 8, Jul. 16, 2019 (Jul. 16, 2019), p. 85006, XP020341771, ISSN: 0268-1242, DOI: 10.1088/1361-6641/AB2CD8 [retrieved on Jul. 16, 2019].

Office Action dated Sep. 9, 2025 for Japan Patent Application No. 2023527421.

Manchon et al., New perspectives for Rashba spin-orbit coupling, Nature Materials, vol. 14, Sep. 2015, published online Aug. 20, 2015, pp. 871-882.

Pan et al., Electric control of topological phase transitions in Dirac semimetal thin films, Scientific Reports, Published Sep. 30, 2015, 10 pages.

* cited by examiner

TOPOLOGICAL QUANTUM FIELD EFFECT TRANSISTOR

CROSS-REFERENCE TO RELATED APPLICATIONS

This application is a U.S. national phase application of International Application No. PCT/AU2021/051306 filed on Nov. 5, 2021, which claims priority to Australian Patent Application No. 2020904052 filed Nov. 6, 2020, the contents of which are incorporated herein by reference in their entireties.

FIELD

The invention relates to structures, such as electronic components including field effect transistors, that include a topological material.

BACKGROUND

Topological insulators are recently discovered materials which possess a bandgap in their interior, however the topology of their electronic states necessitates the existence of gapless, conducting modes on their boundaries—one dimensional (1D) edges in the case of two-dimensional (2D) topological insulators, and 2D surfaces in the case of three-dimensional (3D) topological insulators. These conducting modes are protected from backscattering by time-reversal symmetry, and in the case of 1D edge modes of 2D topological insulators, are expected to be ballistic conductors. Given these properties, topological insulators are thought to be useful in electronic devices such as field effect transistors (FETs).

In conventional semiconductor transistors, a large fraction of power dissipation occurs due to irreversible charging and discharging of the gate capacitor to turn conduction on and off. Its efficiency is characterized by the sub-threshold swing, such that a transistor with a small sub-threshold swing transitions rapidly between its on (high current) and off (low current) states. The sub-threshold swing is the fundamental critical parameter determining the operation of a transistor in low-power applications such as switches. It determines the fraction of dissipation due to the gate capacitance used for turning the device on and off, and in a conventional transistor it is limited by limited by fundamental considerations informally known as "Boltzmann's tyranny" to $k_B T \ln(10)/q$, or 60 mV per decade at room temperature, where $k_B$ is Boltzmann's constant, T is the temperature, and q is the elementary charge.

Strategies to lower the sub-threshold swing of next-generation transistors resort to either tunnelling or electron-electron interactions, whether in the gate capacitor or in the channel. The non-linear dielectric response of ferroelectric insulators can be harnessed to design gate insulators with a negative capacitance and negative-capacitance field-effect transistors (NC-FETs), which increases the bending of the surface potential as a function of the top gate potential, yet this regime tends to be energetically unstable. Tunnelling field effect transistors (TFETs) rely on charge tunnelling between spatially separated valence and conduction bands as a source of carrier injection within a pre-determined energy window, yet tunnelling transport restricts the current in the ON-state to relatively low values.

The topological properties of topological insulators have been shown to lead to regimes in which transport is dissipationless. This provides a new blueprint for transistor design in which conduction is turned on and off via a topological phase transition induced by a gate electric field, that is, conventional carrier inversion is replaced by a topological phase transition. Whilst charge transport inside a topological transistor can be dissipationless, performance is limited by the power dissipated in switching the transistor on and off. In the ideal case of fully dissipationless transport this will account for all the dissipation in the transistor. It is desirable to further enhance the efficiency of a transistor by providing a device with a low subthreshold swing.

It is an object of the invention to address one or more shortcomings of the prior art and/or provide a useful alternative.

SUMMARY OF INVENTION

In a first aspect of the invention, there is provided a structure comprising:

a gate electrode, a dielectric layer, and a planar layer of a topological material being separated from the gate electrode by at least the dielectric layer, and having a contact interface with the dielectric layer to generate an electric field-controlled Rashba spin-orbit interaction on application of an electric field thereto, wherein the topological material exhibits a topological phase transition between a trivial state and a non-trivial state at a critical electric field strength on application of the electric field, wherein the gate electrode is configured to apply the electric field across the planar layer in a direction perpendicular to a plane of the planar layer; and wherein the topological material exhibits a change in bandgap, in the presence of the electric field, having a spin-dependent contribution represented by a proportionality constant $\alpha_R$ and a non-spin-dependent contribution represented by a proportionality constant $\alpha_v$; and wherein $\alpha_R > \alpha_v/3$.

In an embodiment, the topological material exhibits a change in bandgap potential having a spin contribution of magnitude $\Delta_R = \alpha_R E_z$ and a non-spin contribution of magnitude $\Delta_V = \alpha_v E_z$; where: $\Delta_R$ is the spin-dependent contribution to the change in bandgap; $\alpha_R$ is a proportionality constant representing the spin-dependent contribution to the change in bandgap; $\Delta_V$ is the non-spin-dependent contribution to the change in bandgap; and $\alpha_v$ is a proportionality constant representing the non-spin-dependent contribution to the change in bandgap; $E_z$ is the electric field strength.

In a second aspect of the invention, there is provided a structure comprising:

a gate electrode, a dielectric layer, and a planar layer of a topological material being separated from the gate electrode by at least the dielectric layer, and having a contact interface with the dielectric layer to generate an electric field-controlled Rashba spin-orbit interaction on application of an electric field thereto, wherein the topological material exhibits a topological phase transition between a trivial state and a non-trivial state at a critical electric field strength on application of the electric field, wherein the gate electrode is configured to apply the electric field across the planar layer in a direction perpendicular to a plane of the planar layer; and wherein the topological material exhibits a change in bandgap potential having a spin contribution of magnitude $\Delta_R = \alpha_R E_z$ and a non-spin contribution of magnitude $\Delta_V = \alpha_v E_z$;

where:

$\Delta_R$ is the spin-dependent contribution to the change in bandgap;

$\alpha_R$ is a proportionality constant representing the spin-dependent contribution to the change in bandgap;

$\Delta_V$ is the non-spin-dependent contribution to the change in bandgap; and $\alpha_v$ is a proportionality constant representing the non-spin-dependent contribution to the change in bandgap;

$E_z$ is the electric field strength; and wherein $\alpha_R > \alpha_v / 3$.

In an embodiment of the first and second aspects, $\alpha_R > \alpha_v / 2$.

In an embodiment of the first and second aspects, the Rashba spin orbit interaction increases the bandgap of the topological material in the trivial state, and decreases the band gap of the topological material in the non-trivial state.

In an embodiment of the first and second aspects, the topological material has a band crossing that is not at zero momentum.

In an embodiment of the first and second aspects, the band gap or a band crossing of the topological material does not lie at a centre of the Brillouin zone of the topological material. Preferably, the band gap or the band crossing lies at corners of the Brillouin zone.

In an embodiment of the first and second aspects, the planar layer of the topological material is a planar layer of a two-dimensional topological material.

Suitable materials include two dimensional topological insulators, which may be thin layers of materials such as those selected from the group consisting of: $Bi_2Se_3$, $Bi_2Te_3$, $Sb_2Te_3$, $BiTeCl$, $Bi_{1.5}Sb_{0.5}Te_{1.8}Se_{1.2}$, $SmB_6$, $Pt_2HgSe_3$; Dirac semimetals such as those selected from the group consisting of: $WTe_2$ or $Cd_3As_2$; or materials having a staggered honeycomb lattice structure such as bismuthene.

In one form of the above embodiment, the two-dimensional topological material is in the form of a thin film with a thickness of two unit cells or less. Preferably, the thickness of the film is one unit cell.

In an embodiment of the first and second aspects, the topological material has a staggered honeycomb lattice structure.

In one form of the above embodiment, lattice atoms of the staggered honeycomb lattice structure comprise one or more atoms selected from the group consisting of: As, Sb, Bi.

In one form of the above embodiment, the staggered honeycomb lattice is of the form X, XY, or XYZ, where X is an atom selected from the group consisting of As, Sb, Bi, and Y and Z are atoms that are each independently selected from the group consisting of H, Cl, Br, or F.

It is preferred that the staggered honeycomb lattice structure as a ratio of atomic SOI ($\xi$) to Slater-Koster inter-orbital hoping parameter ($V_{spo}$) of greater than 1 (e.g. $\xi / V_{spo} > 1$). Preferably, $\tau / V_{spo} > 1.5$. More preferably, $\xi / V_{spo} > 2$.

In an embodiment of the first and second aspects, the band gap is greater than $10 k_B T$ or 250 meV when the topological material is in the trivial state.

In an embodiment of the first and second aspects, the structure further comprises a source electrode in electrical contact with the topological material, and a drain electrode spaced apart from the source electrode and each in electrical contact with the topological material.

In an embodiment of the first and second aspects, the dielectric layer has a dielectric constant greater than 4. Preferably, the dielectric constant is greater than 6. More preferably, the dielectric constant is greater than 8. Most preferably, the dielectric constant is greater than 10.

In an embodiment of the first and second aspects, the planar layer is in the form of a thin film having a thickness of less than 10 nm. Preferably, the thickness is less than 8 nm. More preferably the thickness is less than 6 nm. Even more preferably the thickness is less than 4 nm. Most preferably, the thickness is less than 2 nm.

In an embodiment of the first and second aspects, the structure is a field effect transistor or a component thereof, and the field effect transistor has a subthreshold swing that is less than 60 mV/dec.

In an embodiment of the first and second aspects, the gate electrode is a first gate electrode and dielectric layer is a first dielectric layer, the structure further comprising a second gate electrode and a second dielectric layer; wherein:

the first gate electrode and the second gate electrode are arranged on opposite sides of the planar layer;

the planar layer of a topological material is separated from the second gate electrode by at least the second dielectric layer, and the second gate electrode is configured to apply an electric field across the planar layer in a direction perpendicular to the plane of the planar layer.

In one form of the above embodiment, the second dielectric layer has a dielectric constant greater than 4. Preferably, the dielectric constant of the second dielectric layer is greater than 6. More preferably, the dielectric constant is greater than 8. Most preferably, the dielectric constant is greater than 10.

In one form of the above embodiment, the first gate electrode and the second gate electrode are operable independently of one another.

In a third aspect of the invention, there is provided a transistor comprising the structure of any one of the preceding claims.

In a fourth aspect of the invention, there is provided a method of operating a structure according to the first or second aspects of the invention or a transistor according to the third aspect of the invention, or embodiments or forms thereof, the method comprising:

applying or modulating a gate voltage to the gate electrode to generate or vary an electric field across the planar layer in a direction perpendicular to a plane of the planar layer; and switching the topological material between the trivial state and the non-trivial state, and modulating the Rashba spin-orbit interaction to alter the bandgap of the topological material.

In embodiments in which: the gate electrode is a first gate electrode and dielectric layer is a first dielectric layer, the structure further comprising a second gate electrode and a second dielectric layer; wherein: the first gate electrode and the second gate electrode are arranged on opposite sides of the planar layer, the planar layer of a topological material is separated from the second gate electrode by at least the second dielectric layer, and the second gate electrode is configured to apply an electric field across the planar layer in a direction perpendicular to the plane of the planar layer; the method according to a fifth aspect of the invention comprises:

applying or modulating a first gate voltage to the first gate electrode and applying or modulating a second gate voltage to the second gate electrode to generate or vary an electric field across the planar layer in a direction perpendicular to a plane of the planar layer; and switching the topological material between the trivial state and the non-trivial state, and modulating the Rashba spin-orbit interaction to alter the bandgap of the topological material.

DESCRIPTION OF EMBODIMENTS

Figure 1:
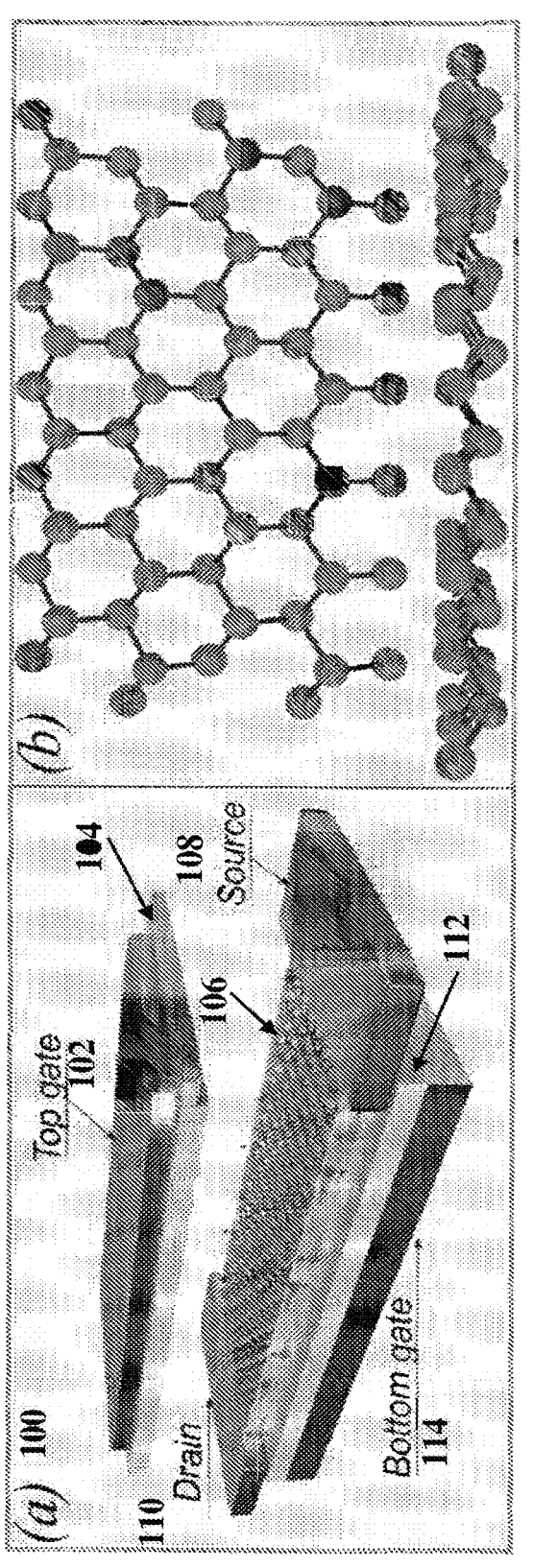
FIG. 1: Topological quantum field effect transistor. In the absence of a gate electric field, a QSH insulator hosts dissipationless helical conducting channels with a minimum value of the quantized conductance $2e^2/h$ (ON state of TQFET (a)). When the gate electric field exceeds a threshold limit, the thin QSH insulator layer (staggered honeycomb lattice (b)) enters into the trivial regime, in which the minimum value of the conductance drops to zero (OFF state). Such electric field switching is accompanied by the topological quantum field effect which enhances the topological phase transition driven by a gate electric field and reduces the sub-threshold swing (c). Here, $\delta$ represents the shift in nontrivial/trivial band gap $E_G$ due to topological quantum field effect.
Figure 1:
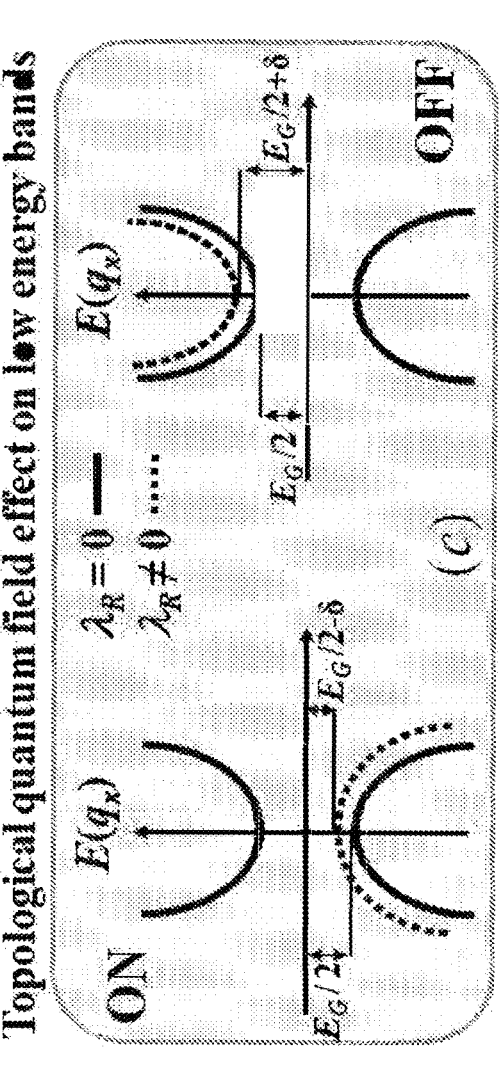

The present invention is directed to a structure comprising: a gate electrode, a dielectric layer, and a planar layer of a topological material that exhibits a topological phase transition between a trivial state and a non-trivial state at a critical electric field strength on application of the electric field, and which is separated from the gate electrode by at least the dielectric layer, and having a contact interface with the dielectric layer to generate an electric field-controlled Rashba spin-orbit interaction on application of an electric field thereto, wherein the gate electrode is configured or positioned to apply the electric field across the planar layer in a direction perpendicular to a plane of the planar layer.

The inventors have found that selecting a topological material that exhibits a change in bandgap, in the presence of the electric field, having a spin-dependent contribution represented by a proportionality constant $\alpha_R$ and a non-spin-dependent contribution represented by a proportionality constant $\alpha_v$ and wherein $\alpha_R>\alpha_v/3$, the sub-threshold swing can be reduced by more than 25% (S*<0:75) compared to Boltzmann's limit in existing topological devices.

In the description below, the inventors outline a solution to the generic problem of the energy gap $E_G$ to transport opened by a gate potential $U_G=qV$ applied to an electrode and demonstrate that Boltzmann's tyranny can be overcome in a non-interacting electron system. The inventors define a reduced sub-threshold swing as $S^*=[dE_G/d(U_G)]^{-1}$, such that the full swing S=S*kBT ln(10)/q, and for a MOSFET in general $[dE_G/d(U_G)]^{-1}\geq1$, so S≥kBT ln(10)/q. For a gapped system described by a single-particle Hamiltonian in the presence of terms linear in the applied potential, with sub-unitary proportionality constants, it has hitherto been assumed that S*≥1. The inventors have overturned this conventional wisdom, demonstrating that S* can be sub-unitary and can be an arbitrarily small positive number, implying that S itself can be smaller than the value predicted by Boltzmann's tyranny in a general class of devices referred to herein as topological transistors.

In particular, the inventors demonstrate that the sub-threshold swing of a topological transistor, in which conduction is enabled by a topological phase transition via electric field switching, can be sizably reduced in a non-interacting system by modulating the Rashba spin-orbit interaction via a top-gate electric field. This effect is referred to herein as the Topological Quantum Field Effect (TQFE). Also disclosed herein is a field effect transistor that makes use of the TQFE, which is referred to herein as a Topological Quantum Field Effect transistor (TQFET). To the inventors' knowledge, the TQFE has no counterpart in conventional metal oxide semi-conductor field effect transistors (MOSFETs). This effect requires both the relativistic quantum mechanical phenomenon of spin-orbit coupling and proximity to a topological phase transition.

The reduction of the sub-threshold swing of a TQFET via Rashba interaction is closely associated with the microscopic bulk band topology stemming from the spin orbit interaction (SOI). Instead of gate induced macroscopic current control, Rashba SOI effectively enhances the gate-induced topological phase transition by controlling the quantum dynamics at the microscopic scale, and hence the macroscopic edge state conductance through the bulk-boundary correspondence. Due to its dependence on the gate electric field, atomic SOI, geometric structure of QSH lattices and the Slater-Koster inter-orbital hopping parameters, the Rashba SOI provides tunable parameters for controlling the sub-threshold swing in a TQFET—rather than relying purely on gate capacitance mechanism.

A transistor based on topologically nontrivial condensed matter systems hosting the quantum spin Hall (QSH) effect can be engineered via a topological phase transition induced by a gate electric field as shown in FIG. 1.

FIG. 1(a) provides a schematic of a dual gate transistor 100 according to one non-limiting embodiment of the invention. However, the skilled addressee will appreciate that a single gate design could also be used. The transistor 100 has a layered structure, comprising from top to bottom a top gate electrode 102, a first dielectric layer 104, a channel formed from a topological material 106, the channel 106 being electrically connected to a source electrode 108 and a drain electrode 110 at opposite ends of the channel 106, a second dielectric layer 112, and a bottom gate electrode 114. In this case, the topological material is one which has a staggered honeycomb lattice as illustrated in FIG. 1(b).

With reference to FIG. 1(c), in the absence of a gate electric field, a topological material, such as a QSH insulator hosts dissipationless helical conducting channels with a minimum value of the quantized conductance $2e^2/h$ (ON state of TQFET).

Near energy-zero, the edge state conductance of QSH lattices in a nanoribbon geometry is (i) quantized, (ii) topologically protected, and (iii) associated with microscopic quantum phenomena in the bulk. The minimum value of the quantized conductance drops from $2e^2/h$ to zero as the system transits from the QSH phase (ON) into the trivial regime (OFF) via electric field switching.

When the gate electric field exceeds a threshold limit, the thin QSH insulator layer (e.g. a material having a staggered honeycomb lattice, see FIG. 1(b)) enters into the trivial regime, in which the minimum value of the conductance drops to zero (OFF state). Such electric field switching is accompanied by the topological quantum field effect which enhances the topological phase transition driven by a gate electric field and reduces the sub-threshold swing. Here, δ represents the shift in nontrivial/trivial band gap $E_G$ due to topological quantum field effect.

Model of a Topological Quantum Field Effect Transistor

The QSH has been proposed in graphene and other group-IV and V honeycomb lattice structures, monolayer transition metal dichalcogenides in the 1T'configuration, thin films of 3D topological insulators $Bi_2Se_3$, as well as the Dirac semimetal $Na_3Bi$. However, it is noted that a small sub-threshold swing requires materials whose gap increases at a fast rate as a function of the top gate voltage, ruling out bilayer graphene, whose gap is found to increase more slowly than initial theoretical predictions.

Consider a tight-binding model Hamiltonian reproducing the effective low energy Dirac theory specialized to QSH materials with honeycomb lattice structures:

$$H = t \sum_{<ij>\alpha} c_{i\alpha}^{\dagger} c_{j\alpha} + i\lambda_{so} \sum_{\ll ij \gg \alpha\beta} v_{ij} c_{i\alpha}^{\dagger} s_{\alpha\beta}^z c_{j\beta} + \qquad \text{Equation 1}$$

-continued $$\frac{\lambda_v}{2} \sum_{<ij>\alpha} c_{i\alpha}^{\dagger} v_i c_{j\alpha} + i\lambda_R(E_z) \sum_{<ij>\alpha\beta} c_{i\alpha}^{\dagger} (s_{\alpha\beta} \times d_{ij})_z c_{j\beta}$$

Here $c\dagger$ ($c_{i\alpha}$) is the creation (annihilation) electron operator with spin polarization $\alpha=\uparrow, \downarrow$ on site i, the Pauli matrix $s^z$ describes the electron intrinsic spin while $s^z_{\alpha\beta}$ are the corresponding matrix elements describing the spin polarization $\alpha$ and $\beta$ on sites i and j, $v_i=+1(-1)$ for sublattice A (B), and $v_{ij}=d_{ik} \times d_{kj}=\pm 1$ connects sites i and j on sublattice A (B) via the unique intermediate site k on sublattice B (A). The nearest-neighbour bond vectors $d_{ik}$ and $d_{kj}$ connect the i (k) and k (j) sites on the A and B sublattices. The first term is the nearest neighbour hopping with amplitude t while the second term is the intrinsic atomic Kane-Mele type SOI of strength $\lambda_{so}$. The third and fourth terms represent the staggered sublattice potential $\lambda_v=U_G$ and spin-mixing Rashba SOI associated with an externally applied gate electric field, $\lambda_R(0)=0$. Since the band gap closes at q=0 during the topological phase transition induced by the electric field, the nnn-intrinsic Rashba SOI is ignored, which does not affect the QSH band gap. In the long wavelength limit, with basis $\psi_k=\{a_{k,\uparrow}, b_{k,\uparrow}, a_{k,\downarrow}, b_{k,\downarrow}\}$, the low energy effective four-band Bloch Hamiltonian H(q) in the vicinity of Dirac points K(K') reads:

$$H(q) = v_F s_0 \otimes (\eta_\tau q_x \sigma_x + q_y \sigma_y) + \qquad \text{Equation 2}$$

$$\eta_\tau \Delta_{so} s_z \otimes \sigma_z + \left(\frac{\Delta_v}{2}\right) s_0 \otimes \sigma_z + \Delta_R(\eta_\tau s_y \otimes \sigma_x - s_x \otimes \sigma_y)$$

where $\eta_\tau=+(-)$ is the valley index representing K(K'), $v_F=3at/2$ is the Fermi velocity where a is the lattice constant, s and $\sigma$ are the spin and pseudospin Pauli matrices respectively, $\Delta_v=\lambda_v$ and $\Delta_{so}=3\sqrt{3}\lambda_{so}$ and $\Delta_R=3\lambda_R/2$ are SOI parameters. As shown in FIG. 1, $\Delta_v=+U_G$ (or $\Delta_v=2U_G$) for sublattice A and $\Delta_v=-U_G$ (or $\Delta_v=0$) for sublattice B in a dual-gate (or a top-gate only) version of the transistor design. The dual gate version is equivalent to a simpler single top gate formulation where top gate adds positive potential terms only, so the A and B sublattices would be at $U_G$ and 0 respectively, which corresponds to applying $+U_G/2$ and $-U_G/2$ with a rigid shift of $U_G=ed_zE_z$. Here $-e$ is the electron charge, $E_z$ is the gate electric field, and $d_z$ is the distance of the ith site from the zero-electric potential site.

Figure 4:
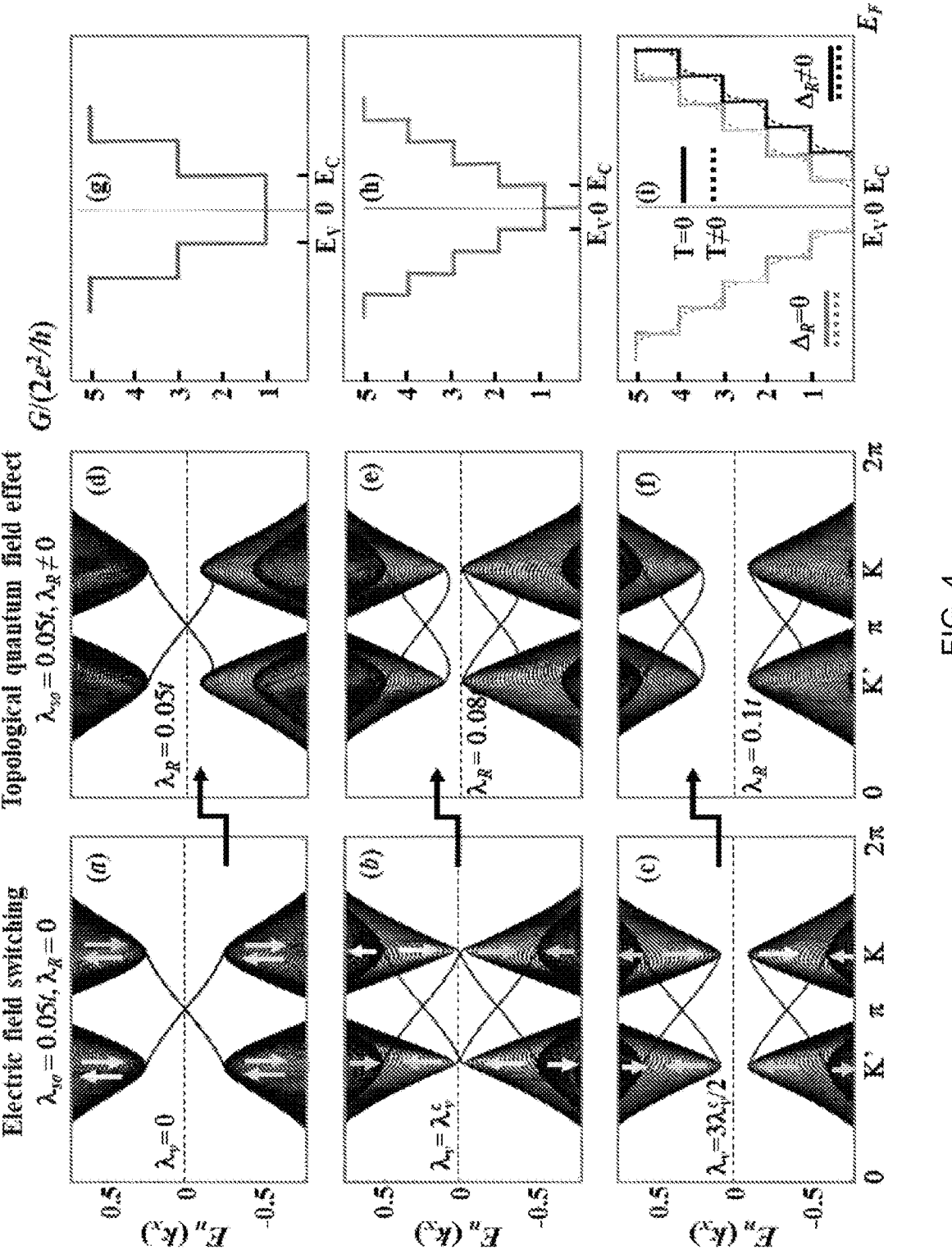
FIG. 4: Edge state dispersion and conductance quantization for semi-infinite honeycomb strip with zigzag edges. (a-c) Electric field switching via topological phase transition showing helical edge states as available conducting channels in the ON state (a), critical gapless phase (b) and the trivial insulator or OFF state (c). (d-f) Topological quantum field effect in the "ON" state reduces the band gap by shifting the valence band along energy axis (d). On the other hand, at the critical point (e) and in the "OFF" state (f), topological quantum field effect enhances the trivial band gap where the maximum of valence band remains pinned but the minimum of conduction band lifted along energy axis. (g-i) Quantized conductance in terms of the number of modes M(E) available at a given energy for TQFET in the QSH phase (g), at the critical point $\lambda_v=\lambda_v^c$ (h) and in the OFF state (i). In the OFF state, (i) shows quantized conductance both with and without topological quantum field effect. In the ON (OFF) state, conductance jumps from $2e^2/h$ (0) to $6e^2/h$ ($2e^2/h$) at the tip of conduction/valence bands lying at the energy $E_c(E_v)$ while the electric field switching (b, e, h) is based upon manipulating the minimal conductance between $2e^2/h$ and 0 and topological quantum field effect enhances this process. Here t=1 eV and the spin chirality of edge states is same as shown for the tips of connecting massive Dirac cones.

Considered is a simple case of electric field switching via a topological phase transition in a topological transistor by assuming that Rashba SOI is negligibly small $\Delta_R \approx 0$ and the spin is a good quantum number. The low-energy single-particle band dispersion in the vicinity of the Dirac point reads:

$$E(q, \lambda_R = 0) = \pm \sqrt{v_F^2|q|^2 + |\Delta_{so} + \eta_s \eta_\tau \Delta_v/2|} \qquad \text{Equation 3}$$

where $\eta_s=+(-)$ stands for the spin up(down) sector and $\eta_\tau=+(-)$ represent valley K(K'). A spin/valley dependent band gap $E_G(\Delta_R=0)=|2\Delta_{so}+\eta_s\eta_\tau\Delta_v|$ opens at the corners of the Brillouin zone (BZ). It shows that the electric field opens/tunes band gaps at both valleys symmetrically but, due to broken spin-valley degeneracy as manifested in FIG. 2, the spin gaps are asymmetric and valley dependent. At a critical point, $\Delta_v=\Delta^c_v=2\Delta_{so}$, the system becomes semi-metallic, with both valleys K(K') perfectly spin-polarized hosting spin down (up) gapless phases. Away from the critical gapless phase, the system remains insulating with a finite band gap $E_G(\lambda_R=0)\neq 0$. The bulk-boundary correspondence, as shown in FIG. 4, confirms that the band gap is topologically nontrivial (QSH phase) for $0<\Delta_v<2\Delta_{so}$ while becoming trivial when $\Delta_v>2\Delta_{so}$.

Figure 2:
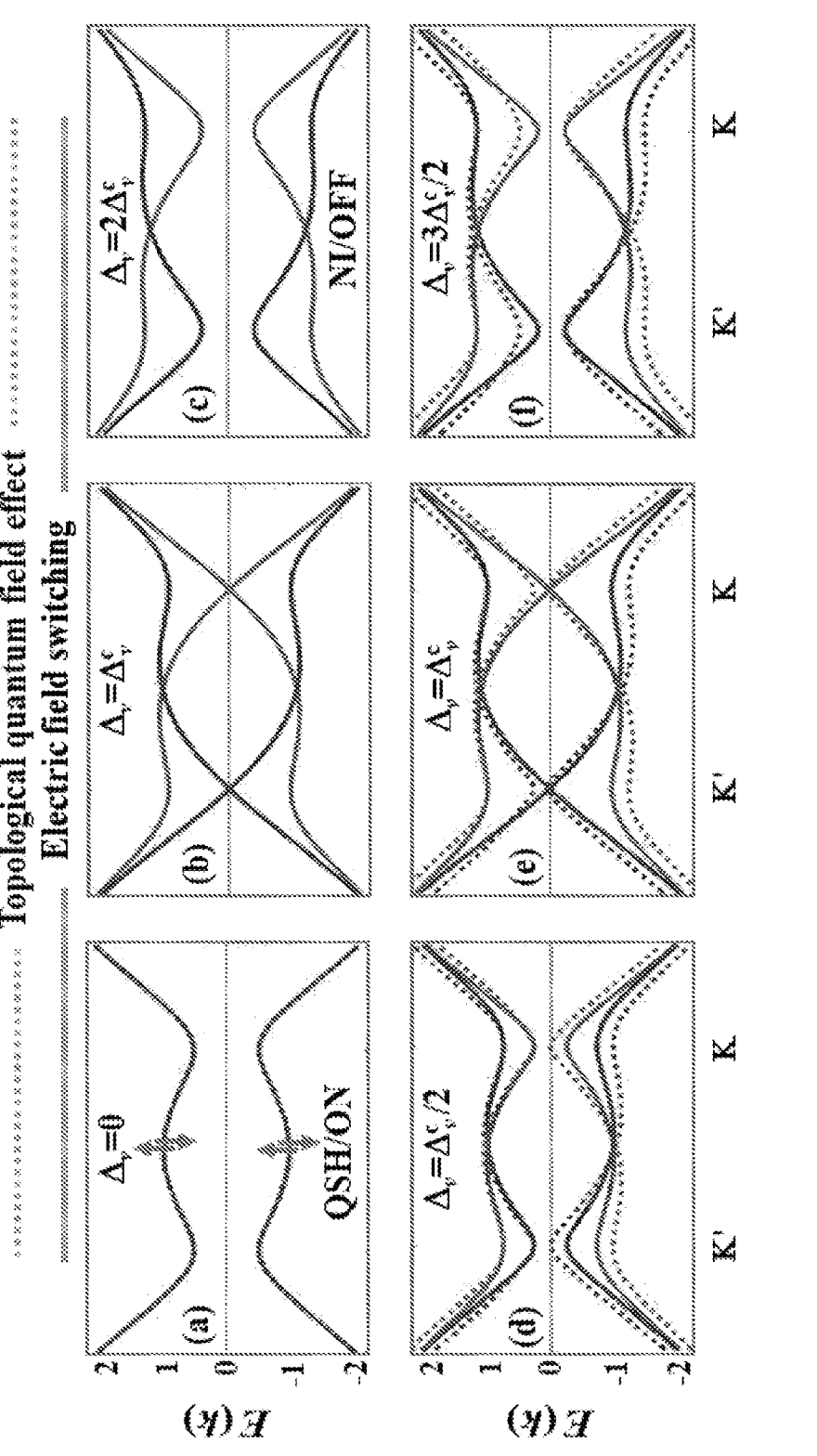
FIG. 2: Electric field switching ($\Delta_R=0$) and Topological quantum field effect ($\Delta_R\neq0$). (a-c) In the absence of Rashba SOI, a uniform out-of-plane electric field drives QSH (a) to normal insulating (NI) phase (c) while passing through a critical point ($\Delta v=\Delta cv$) where valleys K(K') are perfectly spin-polarized hosting spin down (up) gapless states (b). (d-f) The topological quantum field effect reduces the nontrivial band gap (d), opens the trivial band gap at the threshold gate electric field (e), and enhances the trivial band gap (f). The topological quantum field effect speeds up the topological phase transition by opening a trivial band gap when $\Delta_v=\Delta_v^c$ (e) which would otherwise be the critical point in the absence of topological quantum field effect (b). Here t=1 eV, $\Delta_{so}$=0.519 ev, and $\Delta_R$=0.225 eV (d), $\Delta_R$=0.30 eV (e), $\Delta_R$=0.375 eV (f). The solid(dashed) lines represent band dispersion in the absence(presence) of Rashba SOI.

That is, FIG. 2 illustrates electric ($\Delta_R=0$) and the topological quantum field effect ($\Delta R\neq 0$). In the absence of Rashba SOI, a uniform out-of-plane electric field drives QSH (FIG. 2 (a)) to normal insulating (NI) phase (FIG. 2 (c)) while passing through a critical point ($\Delta_v=\Delta^c_v$) where valleys K(K') are perfectly spin-polarized hosting spin down (up) gapless states (FIG. 2(b)). FIG. 2(d-f) show the topological quantum field effect reduces the nontrivial band gap (FIG. 2(d)), opens the trivial band gap at the threshold gate electric field (FIG. 2(e)), and enhances the trivial band gap (FIG. 2(f)). The topological quantum field effect speeds up the topological phase transition by opening a trivial band gap when $\Delta_v=\Delta^c_v$ (FIG. 2(e)) which would otherwise be the critical point in the absence of topological quantum field effect (FIG. 2(b)). Here t=1 eV, $\Delta_{so}$=0.519 eV, and $\Delta_R$=0.225 eV (FIG. 2(d)), $\Delta_R$=0.30 eV (FIG. 2(e)), $\Delta_R$=0.375 eV (FIG. 2(f)). The solid(dashed) lines represent band dispersion in the absence(presence) of Rashba SOI.

Topological Quantum Field Effect on Sub-Threshold Swing

In the transistor geometry shown in FIG. 1, gate electric field $E_z$ applied perpendicular to the plane of 2D topological insulator material contacted by source and drain breaks mirror symmetry $M_z$ and induces spin-mixing Rashba SOI. When electric field induced Rashba SOI is also taken into account as a perturbative effect, the derived expression for the band gap shown in Equation 4, shows that the critical value of the staggered potential for the QSH-to-trivial insulating topological phase transition $\Delta^c_v=2(\Delta_{so}^2)/\Delta_{so}$ is decreased by $2\Delta_R^2/\Delta_{so}$.

$$E_G(\lambda_R \neq 0) = \left| 2\Delta_{so} - \frac{\Delta_v}{2} - \sqrt{\frac{\Delta_v^2}{4} + 4\Delta_R^2} \right| \qquad \text{Equation 4}$$

Both the staggered sublattice potential and accompanied Rashba SOI are linear in the gate electric field $E_z$ and can be simulated as $\Delta_v=\alpha_v E_z$ and $\Delta_R=\alpha_R E_z$ respectively. Here $\alpha_v$ and $\alpha_R$ depend upon the lattice geometry and material specific parameters. The reduced sub-threshold swing of topological transistor then can be written in terms of $\alpha_v$ and $\alpha_R$ via band gap $E_G$ variation with gate electric field $E_z$ as $S^*=[(1/\alpha_v)dE_G/d(E_z)]^{-1}$. In the absence of Rashba SOI, the reduced sub-threshold swing $S^*(\lambda_R=0)$ is restricted to unity—i.e. Boltzmann's tyranny. However, in the process of electric field switching, Rashba SOI also influences the topologically trivial/nontrivial band gap and hence the electric field driven topological phase transition and this effect is denoted as the topological quantum field effect. By incorporating the Rashba effect, Boltzmann's tyranny can be overcome in topological transistors via quantum field effect as:

$$S^*(\lambda_R \neq 0) = \left[ \frac{1}{2} + \sqrt{\frac{1}{4} + \left(\frac{2\alpha_R}{\alpha_v}\right)^2} \right]^{-1} \qquad \text{Equation 5}$$

It shows that a reduced sub-threshold swing of $S^*<0.75$ can easily be achieved when $\alpha_R>\alpha_v/3$. In order to understand the material realization, reduced sub-threshold swing can be quantified via estimation of $\alpha_R$ by finding Slater-Koster inter-orbital hopping parameters. In terms of band theory, mixing between $\sigma$ and $\pi$ bands due to intrinsic atomic SOI and Stark effect leads to a finite Rashba SOI. Based on the sp microscopic tight binding model and 2nd order perturbation theory, the explicit expression for Rashba SOI in buckled Xenes reads $\Delta_R=(ez\xi/3 \sin \theta V_{sp\sigma})E_z$. Here e is the electron charge, z is the Stark matrix element which is proportional to the size of atom at the site i, $\xi$ is the atomic SOI, $\theta$ is the buckling angle, and $V_{sp\sigma}$ is the Slater-Koster parameter corresponding to the a bond formed by the s and p orbitals.

In summary, the impact of topological quantum field effect on the trivial/nontrivial band gaps, critical value of electric field for ON/OFF switching, and reduced sub-threshold swing S* of the TQFET can be simulated in terms of atomic SOI, lattice parameters, and Slater-Koster inter-orbital hopping parameters as:

$$E_G = \left| 2\Delta_{so} - ed_z E_z \left( \frac{1}{2} + \sqrt{\frac{1}{4} + \left(\frac{2z\xi}{3d_z \sin \theta V_{sp\sigma}}\right)^2} \right) \right| \qquad \text{Equation 6}$$

From these expressions, it is apparent that a number of interesting features are captured by the topological quantum field effect.

Firstly, Rashba SOI plays a central role in the topological phase transition driven by the gate electric field: Rashba SOI reduces the nontrivial band gap opened by the intrinsic SOI and enhances the trivial band gap opened by gate electric field. Electric field switching driven by a topological phase transition and the effect of associated topological quantum field effect is shown in FIG. 2. As shown in FIG. 2(d-f), the Rashba SOI is varied while keeping the intrinsic SOI fixed. In the non-trivial regime, the conduction band minima (CBM) at valley K(K') remain insensitive to the Rashba SOI strength. However, Rashba SOI reduces the nontrivial band gap by raising the valence band maxima (VBM) at valley K(K') along the energy axis. On the other hand, in the trivial regime, the VBM at valley K(K') remain pinned at valley K(K') but Rashba SOI increases the trivial band gap by shifting the CBM along the energy axis. The topological quantum field effect is best depicted at the transition point of the TQFET where the critical electric field leads to a gapless phase shown in FIG. 2(b) while the Rashba SOI $\lambda_R\neq 0$ opens a trivial band gap via topological quantum field effect shown in FIG. 2(e). In short, the Rashba spin splitting of the valence (conduction) bands, especially along the edges of the BZ K-M-K', decreases (increases) the band gap in the nontrivial (trivial) regime and speeds up the electric field switching.

Secondly, in the absence of Rashba SOI, the nontrivial (trivial) band gap decreases (increases) linearly with the electric field and the reduced sub-threshold swing remains constant S*=1. However, in the presence of Rashba SOI, up to leading order in atomic SOI $\xi$, the reduced sub-threshold swing decreases with increasing Rashba SOI strength and can be smaller than one, S*<1. In addition, due to its dependence on the geometric structure of QSH lattices, atomic SOI, and the Slater-Koster inter-orbital hopping parameters, the topological quantum field effect provides tunable parameters for controlling the sub-threshold swing in a TQFET— rather than relying purely on the gate capacitance mechanism.

Figure 3:
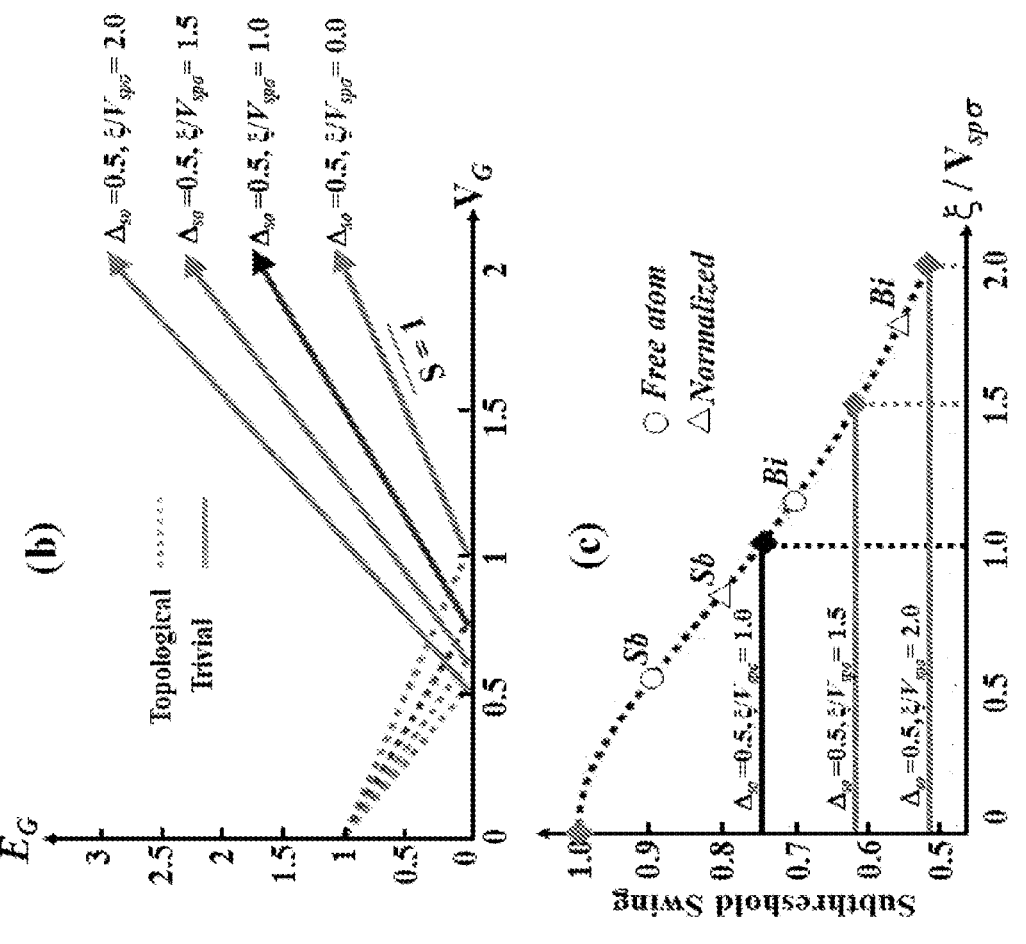
FIG. 3: Topological quantum field effect on band gap, threshold gate voltage, and sub-threshold swing. Topological quantum field effect on the band gap (a), threshold gate voltage (b), and sub-threshold swing (c) is shown corresponding to atomic SOI and Slater-Koster parameter ratio $\xi/V_{sp\sigma}$=1, 1.5, 2. (a) Nontrivial (trivial) bulk band gap EG decreases (increases) sharply with increasing $\xi/V_{sp\sigma}$. Accordingly, the threshold gate voltage (b) and sub-threshold swing (c) decreases with increasing $\xi/V_{sp\sigma}$. Circles (triangles) represent the sub-threshold swing for TQFET based on antimonene and bismuthene with free atomic (normalized) SOI. Here we assume that $d_z\approx z$ and $\sin\theta\approx1$ for quasi-planar/low-buckled honeycomb lattice.
Figure 3:
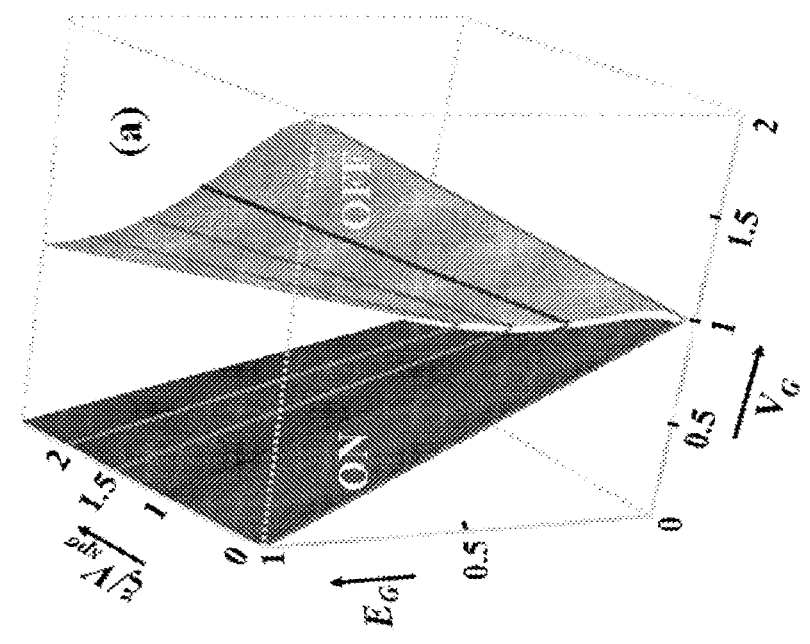

The microscopic orbital picture shows that, for a TQFET based on a quasi-planar/low-buckled honeycomb lattice where $d_z \approx z$ and $\sin \theta \approx 1$, both the threshold gate voltage and the sub-threshold swing decrease with increasing atomic SOI and Slater-Koster parameter ratio $\xi/V_{spo}$. As shown in FIG. 3 and Table 1, 25% reduction in Boltzmann's limit of sub-threshold swing ($S^* < 0.75$) can readily be achieved when $\xi/V_{spo} = 1$. These constraints can be realized realistically in quasi-planar/low-buckled bismuthene sheets with band gap lying at K/K' valleys. Furthermore, in functionalized bismuth monolayers BiX and $Bi_2XY$ where X/Y=H, F, Cl and Br, sub-threshold swing can be decreased by approximately 50% ($S^* \approx 0.5$) when $\xi/V_{spo} \approx 2$ due to enhanced atomic SOI.

The reduction of sub-threshold swing stems from purely microscopic quantum phenomenon and is associated with bulk band topology. For example, FET based on Semenoff type topologically trivial insulating system where $\Delta_{so}=0$, the absolute trivial band gap opened by the gate electric field remains insensitive to the Rashba SOI which is to be contrasted with a TQFET based on QSH materials. Although topological quantum field effect in TQFET based on QSH insulators is indebted to nnn intrinsic SOI $\Delta_{so}$ and hence the bulk band topology, the derived expression for the sub-threshold swing seems to remain independent of $\Delta_{so}$. However, the working of TQFET depends heavily on the nontrivial band gap opened by $\Delta_{so}$: a large intrinsic SOI $\Delta_{so}$ also requires a large gate electric field for topological switching, which automatically raises the strength of the associated Rashba SOI near the energy-zero TQFET operational regime. Using a microscopic tight binding model, the strength of $\Delta_R$ ($\Delta_{so}$) for graphene is 100 times greater (smaller) than the value found based on symmetry analysis. This effect could be more prominent at large gate electric fields for heavy elemental group-V Xenes, especially antimonene and bismuthene with large atomic SOI as shown in FIG. 3. To realize a topologically nontrivial band gap and electric field switching between the QSH and trivial insulator, $\Delta_{so} > \Delta_R$. Otherwise, a honeycomb lattice becomes a zero-gap semiconductor when $\Delta_{so}=\Delta_R$ and a trivial metal for $\Delta_{so} < \Delta_R$.

Following a simple Landauer approach, the minimal quantized conductance can be obtained by finding the solution of the low energy effective tight-binding Hamiltonian for QSH honeycomb nanoribbons with zigzag edges. Close to equilibrium, $\mu_1 = \mu_2 = E_F$ where $\mu_{1(2)}$ is the chemical potential at the left (right) contact and $E_F$ is the Fermi energy which is controllable via doping, the conductance of a honeycomb nanoribbon with zigzag edges is calculated as a function of $E_F$. FIG. 4 displays the conductance quantization at gate electric field $E_z=0$, $E_z=E_{zc}$, and $E_z>E_{zc}$ which correspond to "ON", "transition point", and "OFF" state of TQFET respectively.

In the QSH regime, at half filling, topologically protected edge states connecting opposite valleys cross the energy-zero at the time-reversal invariant momentum. With increasing $E_F$, the Fermi level crosses new bands and opens new channels for conductance. That is, as shown in FIG. 4(b), the low-energy modes representing edge states (n=0) are valley non-degenerate while all the high-energy modes representing bulk states (n=1, 2, 3, . . . ) are twofold valley-degenerate. As a result, the number of transverse modes available at energy E can be expressed as M(E)=2n+1. In addition, all the modes available for conductance retain a twofold spin degeneracy. Since each mode (for each spin and valley degree of freedom) acts as a channel that contributes to the conductance by $e^2/h$, the low-bias and low-temperature quantized conductance in the "ON" state of a TQFET can be expressed as $G_{ON}=(2e^2/h)(2n+1)\check{T}$. Here $\check{T}$ is the corresponding transmission probability per mode which goes to unity in ballistic QSH regime. As shown in FIG. 4(c), the conductance plateau for $G_{ON}/(2e^2/h)$ appears at the "odd" integer values.

To estimate the conductance in the OFF state the Landauer approach is again adopted, assuming the channel to be connected to semiconducting leads so that the gap to transport is $E_G$. In the trivial insulating regime, as shown in FIG. 4(h), the near zero-energy minimum conducting channels vanishes due to dominating staggered potential term. Additionally, in the presence of SOI, the electric field also lifts the spin degeneracy such that the total number of conducting modes available at low energy are M(E)=2n. As a result, the zero-temperature conductance in the trivial regime can be approximated as $G_{OFF}=(2e^2/h)n\check{T}$. Note that, unlike spin-degenerate spectrum in QSH phase, the factor of 2 in conductance $G_{OFF}$ is due to valley degrees of freedom and the corresponding conductance plateau for $G_{OFF}/(2e^2/h)$ appears at integer values n=0, 1, 2, 3 . . . as shown in FIG. 4(i). Since the interest here is in manipulating the minimal conductance quantum, as the working of a TQFET deals with the shift from conductance quantum $2e^2/h$ to 0, the opted Landauer approach in trivial phase is also a reasonable approximation as long as the system is at half filling and the Fermi-level lies within the band gap EG of the nanoscale TQFET.

By using the Landauer formula, where the total electron transmission probability $M(E)\check{T}$ at energy E is convoluted with the energy derivative of the Fermi function df(E)/dE, the conductance $G_{OFF}$ of the OFF state is also plotted as a function of the Fermi energy at finite temperature. As shown in FIG. 4(i), the conductance plateaus become smoother for T>0. As expected, the topological quantum field effect shifts the conductance plateau of $G_{OFF}$ along the energy axis as shown in FIG. 4(i). It is consistent with the band evolution for both infinite sheet as shown in FIG. 2 and semi-infinite sheet as shown in FIG. 4(d). In the OFF state, the topological quantum field effect enhances the trivial band gap where the maximum of the valence band remains pinned but the minimum of the conduction band is lifted along the energy axis.

Material Realization

In general, both group-IV and group-V Xenes are QSH insulators and can serve the purpose of channel in topological FET. However, as shown in Table 1, weak Rashba SOI in group-IV Xenes has negligibly small effect on the sub-threshold swing. On the other hand, group-V Xenes with large atomic SOI such as bismuthene or functionalized bismuth monolayers BiX and $Bi_2XY$ where X/Y=H, F, Cl and Br, are promising materials for realizing topological quantum field effect in the proposed transistor geometry.

Various group-V monolayer structures such as free-standing (As, Sb, Bi) monolayers, (As, Sb, Bi) monolayers on SiC substrate, and functionalized bismuth monolayers BiX and $Bi_2XY$ are large gap QSH insulators. However, the framework developed by the inventors for TQFET with reduced sub-threshold swing ($S^* < 0.75$) and high ON/OFF ratio ($10^5 \sim 10^{10}$) with large band gap in the OFF state (>10kT or 250 meV) for functioning at room temperature highly desires buckled structure with bulk band gap away from the centre of Brillouin zone $\Gamma$. While buckling is important in one or more embodiments to realize electric field switching via topological quantum field effect, band gap at the corners of the Brillouin zone K(K') are highly desired for large bulk-band splitting via topological quantum field effect: Rashba SOI efficiently tunes the band gap by splitting the top/bottom of the valence/conduction bands lying at K(K') but has no effect on the band gap opened at the time-reversal invariant momenta.

While band gap in all the group-IV Xene structures, planar graphene and buckled silicene, germanene, and stanene, lies at the valleys K(K'), location of Dirac points and the band gap in group-V Xenes depends upon the geometric structure, substrate effect, and their functionalization. For example, the Dirac points and the band gap lie at the high symmetry Γ-point in free-standing (As, Sb, Bi) monolayers with buckled honeycomb structures. However, (As, Sb, Bi)/SiC stabilizes in a planar honeycomb structure and hosts Dirac points and the band gap at the corners of the Brillouin zone. On the other hand, functionalized bismuth monolayers BiX and $Bi_2XY$ are ideal candidates where low-buckling is induced by X/Y atoms while the Dirac points or the bulk band gap lies at the valleys K(K'). Table 1 summarizes the strength of atomic SOI, Slater-Koster parameter Vspσ and sub-threshold swing in the presence of Rashba SOI for group-IV and V Xenes.

TABLE 1

Strength of atomic SOI ξ, Slater-Koster parameter $V_{spσ}$ and sub-threshold swing S+ for TQFET based on group-IV and V Xenes.

| | ξ(eV ) | | | $V_{spσ}$ | S*‡ |
| --- | --- | --- | --- | --- | --- |
| | Free atom | Normalised | Experimental† | (eV) | ΔR ≠ 0 |
| Graphene | 0.006 | 0.009 | — | 5.580 | 0.999[0.999] |
| Silicene | 0.028 | 0.044 | (-)0.044 | 2.54 | 0.999[0.999] |
| Germanene | 0.2 | 0.29 | (0.2)0.29 | 2.36 | 0.996[0.993] |
| Stanene | 0.6 | 0.8 | (0.48)0.77 | 1.953 | 0.961[0.934] |
| Arsenene | 0.29(0.36) | 0.421 | — | 1.275 | 0.978[0.955] |
| Antimonene | 0.6(0.8) | 0.973 | — | 1.170 | 0.904[0.802] |
| Bismuthene | 1.5 | 2.25 | — | 1.3 | 0.707[0.568] |

Note:
it is assumed that $d_z ≈ z$ and $sinθ ≈ 1$ for quasi-planar/low-buckled honeycomb lattice.
Similar to other group-IV and V elements, a normalization factor of 3/2 is also multiplied to bismuthene free atomic SOI.
†Entries in parentheses represent the experimental values for neutral atomic SOI.
‡Entries in brackets represent the sub-threshold swing for normalized SOI.

Finally, the free atomic SOI ξ=1.25 for bismuthene sheets can be further enhanced in functionalized bismuth monolayers BiX and $Bi_2XY$. The spin-orbit splitting in free Ge atoms is 0.2 eV while in the solid it is 0.29 eV. Similarly, a renormalization factor of 3/2 works well for other group-IV and V structures. Hence, the inventors considered both the free atomic $ξ_0$=1.5 eV and normalized SOI $ξ_N=3ξ_0/2$=2.25 eV for bismuthene as listed in Table 1. Such a large renormalization can be understood as follows: The SOI term $(ℏ/4m^2c^2)(∇V×p)·σ$ reduces to the form ξ(r)l·s where $ξ(r)=(ℏ^2/4m^2c^2)(∂V/∂r)$ when V is approximated to be spherically symmetric. In terms of Wannier functions $w^s_k(r-d)$ centered about each lattice point whose vector coordinates are denoted by d, the SOI matrix elements are approximated as:

$$\langle ψ_s(k) \left| \frac{ℏ}{4m^2c^2} ∇V(r-d) × p).σ \right| ψ_L(k') \rangle = δ_{kk'},$$  (Equation 9)

$$\langle ω^ξ_k(r) | ξ(r)l·s | ω^ξ_k(r) \rangle$$

where wavefunctions $ψ_s(k)$ are superposition of Wannier functions and V (r-d) is the potential with a centre of symmetry at each lattice point. In tight binding methods, ξ(r) is approximated as the strength of SOI under various constraints such that (i) The Wannier functions centered about different lattice points are orthogonal and hence localized in the Wigner-Seitz cell; (ii) V (r-d) centered about different lattice points possess spherical symmetry and is the same in each Wigner-Seitz cell and vanishes outside. However, the Wannier functions are not fully orthogonal and the potential V does not have full spherical symmetry because of the surrounding atoms in a solid. Hence, the spilling over of Wannier functions into the nearest cells and the lower symmetry of V lead to a substantial modification/renormalization.

The SOI renormalization is highly dependent on the various ionic configurations of group-IV and V elements in diamond and zinc-blended compounds. Due to the partial ionic character of chemical bonding, the spin-orbit splitting of cation p-states in the compounds of group-IV and V elements depends upon the time spent by an electron around cation and anion sites. So the SOI of the cation p-states in the group IV and V compounds, if displaying a similar QSH phase and a QSH to trivial insulator transition, can be further enhanced for quantum devices. Following these lines, even for purely group-IV and V elemental honeycomb lattices, the atomic functions/orbitals near the top of valence bands need not be purely p-like but can have admixtures of higher angular momentum (d-like) states. That is, the renormalized SOI of cation p-states can be increased by either (i) promoting s and p electrons to higher states, or (ii) completely removing s and p electrons as in the ion. It can be achieved either through shining light or though gate controlled tuning of the energy of electronic states whose eigenvectors are non-vanishing at the singularities of the potential V (r-d).

CONCLUSION

In summary, the inventors have analysed the working of TQFET, employing the energy-zero edge state of QSH honeycomb nanoribbons, based on the conductance which is quantized, topologically protected, and indebted to the intrinsic microscopic quantum phenomena such as SOI and band topology. The inventors have found that, associated with SOI and band topology and hence contrary to conventional semiconductor such as MOSFET or bilayer graphene, the topological quantum field effect enhances the electric field switching and reduces the sub-threshold swing without any lower bound. This is subject to the topological quantum field effect modelled via Rashba SOI which provides tunable parameters for controlling the electric field switching and sub-threshold swing, in stark contrast to gate capacitance mechanism in conventional semiconductor transistor where sub-threshold swing is bounded by Boltzmann's tyranny. The derived expression for bulk band gap, critical electric field, and sub-threshold swing explicitly demonstrate that the working of TQFET can be controlled via geometric structure of QSH lattices, atomic SOI, and the Slater-Koster inter-orbital hopping parameters.

While incorporating the topological quantum field effect in engineering TQFET, a decrease of more than 25% compared to Boltzmann's limit of sub-threshold swing is possible when $\xi/V_{spo}>1$ which can be realized in a bismuthene like staggered honeycomb structures. The sub-threshold swing can be further reduced through lattice distortion via strain and substrate effect: tuning of Slater-Koster parameters and Stark matrix elements and optimizing the Rashba SOI and buckling parameters. It shows that, unlike conventional semiconductor transistors, a TQFET does not have sharp lower bound on its sub-threshold swing and hence no topological tyranny. In summary, topological quantum field effect, an alternate mechanism for reducing the sub-threshold swing, provides a promising platform for further research and developing energy-efficient quantum devices.

In passing, the topological quantum field effect can be employed for simulating substrate effects in experimental condensed matter physics. Theoretically modelling of Rashba SOI induced by inter-action between sample and substrate is more difficult as compared to one due to gate electric field. TQFET incorporating the topological quantum field effect can be employed as a device for estimating/modelling substrate induced Rashba SOI: first measure the sub-threshold swing for free-hanging 2D sheet and then perform the measurement again while incorporating the substrate effects. The strength of the substrate-induced Rashba SOI can be simulated via reduction in the sub-threshold swing of the TQFET.

Although the invention has been described in connection with aspects and preferred embodiments thereof, it should be understood that various modifications, additions and alterations may be made to the invention by one skilled in the art without departing from the spirit and scope of the invention as defined in the appended claims.

The invention claimed is:

1. A structure comprising:
a gate electrode,
a dielectric layer, and
a planar layer of a topological material being separated from the gate electrode by at least the dielectric layer, and having a contact interface with the dielectric layer to generate an electric field-controlled Rashba spin-orbit interaction on application of an electric field thereto,
wherein the topological material exhibits a topological phase transition between a trivial state and a non-trivial state at a critical electric field strength on the application of the electric field,
wherein the gate electrode is configured to apply the electric field across the planar layer in a direction perpendicular to a plane of the planar layer; and
wherein the topological material exhibits a change in bandgap, in presence of the electric field, having a spin-dependent contribution represented by a proportionality constant $\alpha_R$ and a non-spin-dependent contribution represented by a proportionality constant $\alpha_v$; and
wherein $\alpha_R>\alpha_v/3$.

2. The structure of claim 1, wherein the Rashba spin orbit interaction increases the bandgap of the topological material in the trivial state, and decreases the band gap of the topological material in the non-trivial state.

3. The structure of claim 1, wherein the bandgap or a band crossing of the topological material does not lie at a center of a Brillouin zone of the topological material.

4. The structure of claim 3, wherein the bandgap or the band crossing lies at corners of the Brillouin zone.

5. The structure of claim 1, wherein the planar layer of the topological material is a planar layer of a two-dimensional topological material.

6. The structure of claim 5, wherein the two-dimensional topological material is in a form of a thin film with a thickness of two unit cells or less.

7. The structure of claim 1, wherein the topological material has a staggered honeycomb lattice structure.

8. The structure of claim 7, wherein lattice atoms of the staggered honeycomb lattice structure comprise one or more atoms selected from the group consisting of: As, Sb, Bi.

9. The structure of claim 7, wherein the staggered honeycomb lattice is of a form X, XY, or XYZ, where X is selected from the group consisting of As, Sb, Bi, and Y and Z are each independently selected from the group consisting of H, Cl, Br, or F.

10. The structure of claim 7, wherein the staggered honeycomb lattice structure as a ratio of atomic SOI ($\xi$) to Slater-Koster inter-orbital hoping parameter ($V_{spo}$) of greater than 1.

11. The structure of claim 1, wherein the bandgap is greater than 10kT or 250 meV when the topological material is in the trivial state.

12. The structure of claim 1, wherein the structure further comprises a source electrode in electrical contact with the topological material, and a drain electrode spaced apart from the source electrode and in electrical contact with the topological material.

13. The structure of claim 1, wherein the dielectric layer has a dielectric constant greater than 4.

14. The structure of claim 1, wherein the planar layer is in a form of a thin film having a thickness of less than 10 nm.

15. The structure of claim 1, wherein the structure is a field effect transistor or a component thereof, and the field effect transistor has a subthreshold swing that is less than 60 mV/dec.

16. The structure of claim 1, wherein the gate electrode is a first gate electrode and the dielectric layer is a first dielectric layer, the structure further comprising a second gate electrode and a second dielectric layer; wherein
the first gate electrode and the second gate electrode are arranged on opposite sides of the planar layer;
the planar layer of a topological material is separated from the second gate electrode by at least the second dielectric layer, and
the second gate electrode is configured to apply an electric field across the planar layer in a direction perpendicular to the plane of the planar layer.

17. The structure of claim 16, wherein the first gate electrode and the second gate electrode are operable independently of one another.

18. A method of operating the structure according to claim 16, the method comprising:
applying or modulating a first gate voltage to the first gate electrode and applying or modulating a second gate voltage to the second gate electrode to generate or vary an electric field across the planar layer in a direction perpendicular to a plane of the planar layer; and switching the topological material between the trivial state and the non-trivial state, and modulating the Rashba spin-orbit interaction to alter the bandgap of the topological material.

19. A transistor comprising the structure of claim 1.

20. A method of operating the structure according to claim 1, the method comprising:

applying or modulating a gate voltage to the gate electrode to generate or vary an electric field across the planar layer in a direction perpendicular to a plane of the planar layer; and switching the topological material between the trivial state and the non-trivial state, and modulating the Rashba spin-orbit interaction to alter the bandgap of the topological material.

21. A structure comprising:

a gate electrode, a dielectric layer, and a planar layer of a topological material being separated from the gate electrode by at least the dielectric layer, and having a contact interface with the dielectric layer to generate an electric field-controlled Rashba spin-orbit interaction on application of an electric field thereto, wherein the topological material exhibits a topological phase transition between a trivial state and a non-trivial state at a critical electric field strength on the application of the electric field, wherein the gate electrode is configured to apply the electric field across the planar layer in a direction perpendicular to a plane of the planar layer; and wherein the topological material exhibits a change in bandgap potential having a spin-dependent contribution of magnitude $\Delta_R = \alpha_R E_z$ and a non-spin-dependent contribution of magnitude $\Delta_v = \alpha_v E_z$;

where:

$\Delta_R$ is the spin-dependent contribution to the change in the bandgap potential;

$\alpha_R$ is a proportionality constant representing the spin-dependent contribution to the change in bandgap;

$\Delta_v$ is the non-spin-dependent contribution to the change in the bandgap potential; and $\alpha_v$ is a proportionality constant representing the non-spin-dependent contribution to the change in the bandgap potential;

$E_z$ is a strength of the electric field applied thereto and wherein $\alpha_R > \alpha_v/3$.

* * * * *